United States Patent [19]

Shou et al.

[11] Patent Number: 5,563,544

[45] Date of Patent: Oct. 8, 1996

[54] COMPUTATIONAL CIRCUIT

[75] Inventors: Guoliang Shou; Sunao Takatori; Makoto Yamamoto, all of Tokyo, Japan

[73] Assignees: Yozan, Inc., Tokyo; Sharp Corporation, Osaka, both of Japan

[21] Appl. No.: 487,154

[22] Filed: Jun. 7, 1995

Related U.S. Application Data

[62] Division of Ser. No. 262,059, Jun. 17, 1995.

[30] Foreign Application Priority Data

| Jun. 17, 1993 | [JP] | Japan | 5-171041 |
| Jun. 18, 1993 | [JP] | Japan | 5-172551 |
| Jun. 18, 1993 | [JP] | Japan | 5-172552 |
| Jun. 22, 1993 | [JP] | Japan | 5-174713 |
| Jun. 24, 1993 | [JP] | Japan | 5-177362 |
| Jun. 30, 1993 | [JP] | Japan | 5-187215 |
| Sep. 20, 1993 | [JP] | Japan | 5-256355 |
| Sep. 20, 1993 | [JP] | Japan | 5-256359 |
| Sep. 20, 1993 | [JP] | Japan | 5-256367 |
| Sep. 20, 1993 | [JP] | Japan | 5-256518 |
| Sep. 20, 1993 | [JP] | Japan | 5-256557 |
| Sep. 20, 1993 | [JP] | Japan | 5-256558 |
| Apr. 1, 1994 | [JP] | Japan | 6-087720 |

[51] Int. Cl.⁶ ........................ G06G 7/14
[52] U.S. Cl. ............... 327/361; 327/75; 327/77
[58] Field of Search ........................ 327/359, 361, 327/63, 65, 68, 70, 77, 71, 74, 75, 82, 85, 89, 354–356

[56] References Cited

U.S. PATENT DOCUMENTS

| 3,617,649 | 1/1965 | Walp | 327/356 |
| 3,675,238 | 7/1972 | Butscher | 327/75 |
| 3,701,144 | 10/1972 | Fineran et al. | 327/75 |
| 4,006,348 | 2/1977 | Ochiai et al. | 327/355 |
| 4,028,506 | 6/1977 | Araseki et al. | 327/58 |
| 4,697,098 | 9/1987 | Cloke | 327/58 |
| 5,408,422 | 4/1995 | Takatori et al. | 327/94 |
| 5,444,411 | 8/1995 | Yang et al. | 327/361 |

Primary Examiner—Timothy P. Callahan
Assistant Examiner—T. Lam
Attorney, Agent, or Firm—Cushman Darby & Cushman, L.L.P.

[57] ABSTRACT

A comparator circuit in an analog computational device includes a complement circuit that receives a first analog input. The complement circuit outputs a quantized complement of the first input to first and second addition circuits. A second analog input is also provided to the first and second addition circuits. The first and second addition circuits add the complement circuit output to the second analog input and provide a low output if the result of the addition exceeds threshold values set for the first and second addition circuits. The outputs of the first and second addition circuits are provided to a judging circuit to determine which is greater.

2 Claims, 6 Drawing Sheets

COMPUTATIONAL CIRCUIT

This is a division of application Ser. No. 08/262,059, filed Jun. 17, 1995.

BACKGROUND OF THE INVENTION

1. Field of the Invention

The present invention relates to computational circuits for calculating addition, multiplication, comparison, quantizing and exponentials of substantially analog values.

2. Description of the Related Art

In conventional digital computers, computations are performed by using many combinations of simple digital logic circuits. Digital computation is accurate and redundant. However, it is limited due to the large equipment costs necessary for high precision manufacturing of digital circuits. Analog computation was frequently used for solving differential equations, but because of the limitations of digital devices noted above, analog computation is now attracting attention. Operational amplifiers are used in conventional analog computation. However, a lot of electric power is necessary for large scale analog computation because it is driven by current. As a result, it is difficult to provide a practical circuit for performing a complicated large scale calculation.

SUMMARY OF THE INVENTION

Therefore, it is an object of the present invention to provide an analog computational circuit for performing a large scale and complicated computation. According to the present invention, various combination circuits are proposed in which addition is performed by a capacitive coupling and multiplication is performed by weighting of the capacitive coupling. Multiplication is also performed by means of a logarithmic calculation circuit for transforming a voltage into a time length, which is also useful for exponential calculation.

DETAILED DESCRIPTION OF THE PRESENTLY PREFERRED EMBODIMENTS

Hereinafter, a first embodiment of a computational circuit according to the present invention is described.

Figure 1:
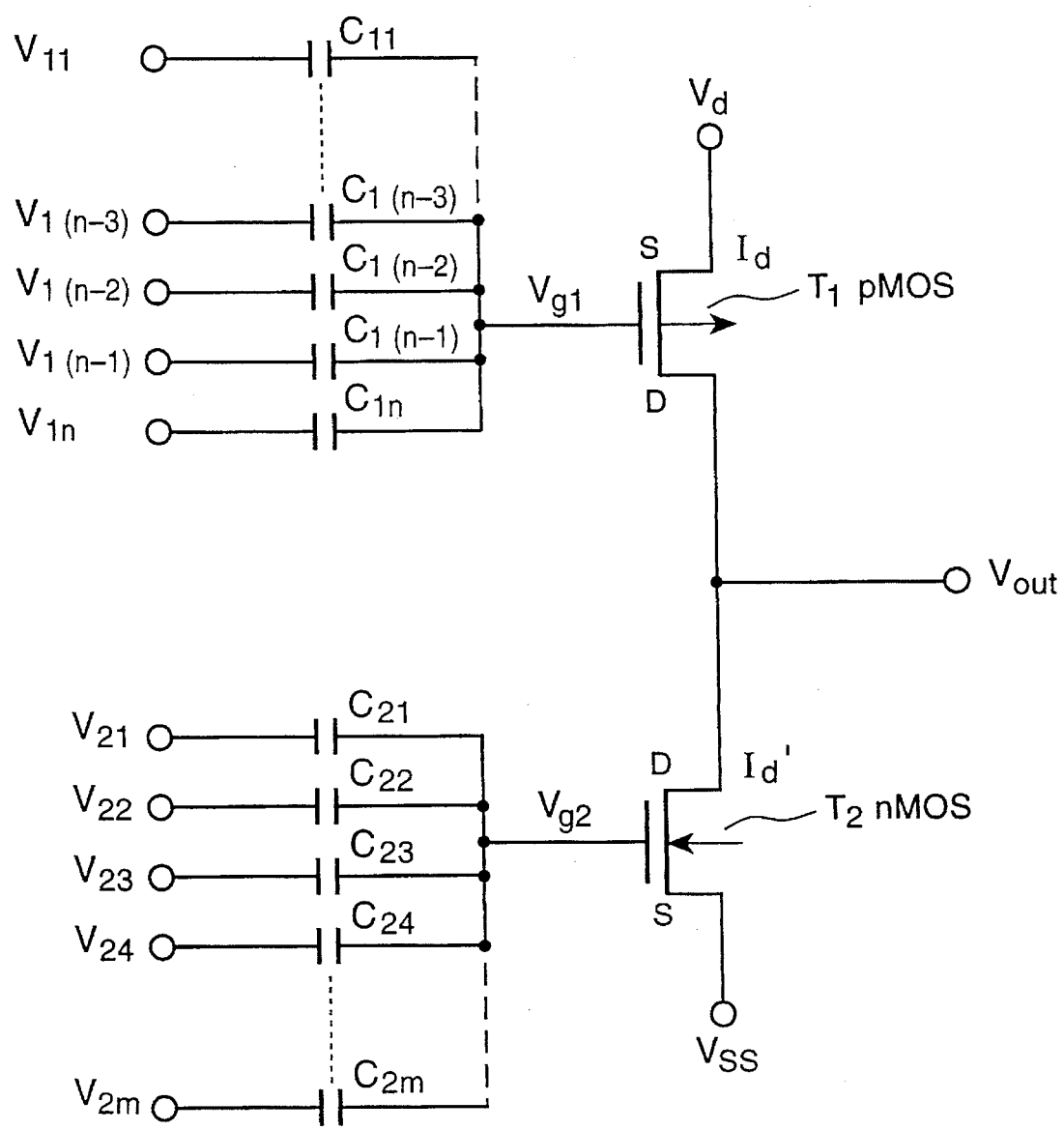
FIG. 1 is a circuit diagram showing the first embodiment of an addition circuit.

In FIG. 1, a circuit for addition and substraction is shown. The circuit of FIG. 1 models a neural network having excitatory and inhibitory synapses. Inputs on the excitatory synapses cause an output of the neuron to have a high level, such as "1," while inputs on the inhibitory synapses cause the output to have a low level.

Inputs are given as voltage signals V11 to V1n for the excitation synapses and V21 to V2n for the inhibitory synapses. The addition circuit includes an enhancement type pMOS FET transistor T1 and an enhancement type nMOS FET transistor T2. A drain of T1 is connected to a high voltage source Vd. A source of T1 is connected to a drain of T2, and a source of T2 is connected to a low voltage source Vss, for example, ground. A first capacitive coupling is provided for excitatory addition and consists of capacitors C11 to C1n connected in parallel to a gate of T1, each of which receives one input from V11 to V1n. A second capacitive coupling is provided for inhibitory addition and consists of capacitors C21 to C2n connected in parallel to a gate of T2, each of which receives one input from V21 to V2n. Capacitive couplings perform an adding circuit because the integrated output voltage V'out can be defined as follows:

$$V'out = \sum_{i}^{n} C1i V1i / \sum_{i}^{n} C1i$$

$$V'out = \sum_{i}^{n} C2i V2i / \sum_{i}^{n} C2i$$

When T1 and T2 operate in the saturated area, that is, $$Vd1 \geq (Vg1-Vt1) > 0 \text{ and } Vd2 \geq (Vg2-Vt2) > 0, \text{ where} \tag{1}$$

Vd1, Vd2 are the drain voltages of T1 and T2, respectively,

Vg1, Vg2 are the gate voltages of T1 and T2, respectively, and

Vt1, Vt2 are the threshold voltages of T1 and T2, respectively, the currents Id and Id' through T1 and T2 are approximately expressed as follows:

$$Id = (k1/2)(W/L)(Vg1-Vt1)^2 \{1+\lambda 1(Vd-Vout)\} \tag{2}$$

$$Id' = (k2/2)(W/L)(Vg2-Vt2)^2 \{1+\lambda 2 Vout\}, \text{ where} \tag{3}$$

$$k1 = \mu n1 Cox1 \tag{4}$$

$$k2 = \mu n2 Cox2 = 2k1, \text{ wherein} \tag{5}$$

μn1 is the carrier mobility in the channel area of T1,

μn2 is the carrier mobility in the channel area of T2,

Cox1 is the capacitance of the gate oxide layer of T1,

Cox2 is the capacitance of the gate oxide layer of T2,

W is the channel width,

L it the channel length,

λ1 is the index representing the output resistance of T1,

λ2 is the index representing the output resistance of T2, and

Vout is the output voltage between the source of T1 and the drain of T2.

$\lambda 1$ and $\lambda 2$ are equal to $(1/Va)$, which corresponds to an inversion of the voltage Vds when Id=0 on the extended line of static performance in the saturated area. It is also called the "channel length modulation effect factor." Since $\lambda 1=\lambda 2$, both are represented by "$\lambda$".

If no current flows from the output terminal, the formulas (2) and (3) are equal to each other. Therefore, $$(k1/2)(W/L)(Vg1-Vt1)^2 \{1+\lambda(Vd-Vout)\}=(k1/2)(W/L)(Vg2-Vt2)^2 \{1+\lambda Vout\} \quad (6)$$

Formula (6) is simplified by replacing the squared terms, as follows.

$$V1\{1+\lambda(Vd-Vout)\}=2\times V2(1+\lambda Vout) \quad (7)$$

$$V1=(Vg1-Vt1)^2, V2=(Vg2-Vt2)^2 \quad (8)$$

By replacing $X=(V2/V1)$, formula (7) is further simplified.

$$\{1+\lambda(Vd-Vout)\}=2X(1+\lambda Vout) \; Vout=(1-2X+\lambda Vd)/\{\lambda(1+2X)\} \quad (9)$$

Figure 2:
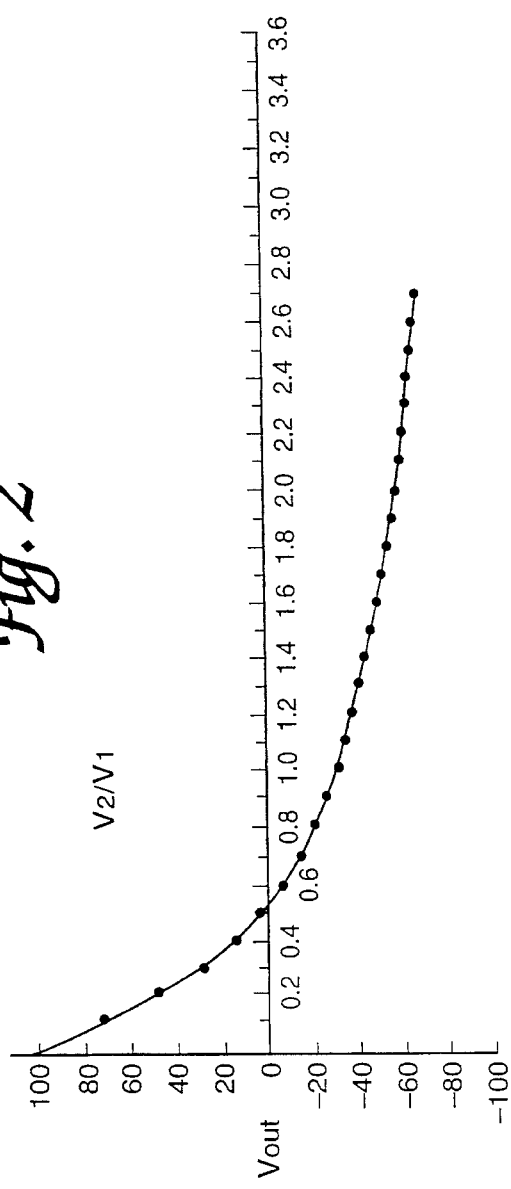
FIG. 2 is a diagram of the input/output characteristics of V2/V1 of the circuit in FIG. 1.

Here, $$Vout=(1+\lambda Vd)/\lambda \;(X=0) \quad (10)$$

$$Vout=-(1/\lambda) \; (X\to\infty) \quad (11)$$

and the total performance is shown in FIG. 2. Next, an inversion of X is defined as Z so that $$Vout=(Z+\lambda Vd-2)/\{\lambda(Z+2)\}. \quad (12)$$

Figure 3:
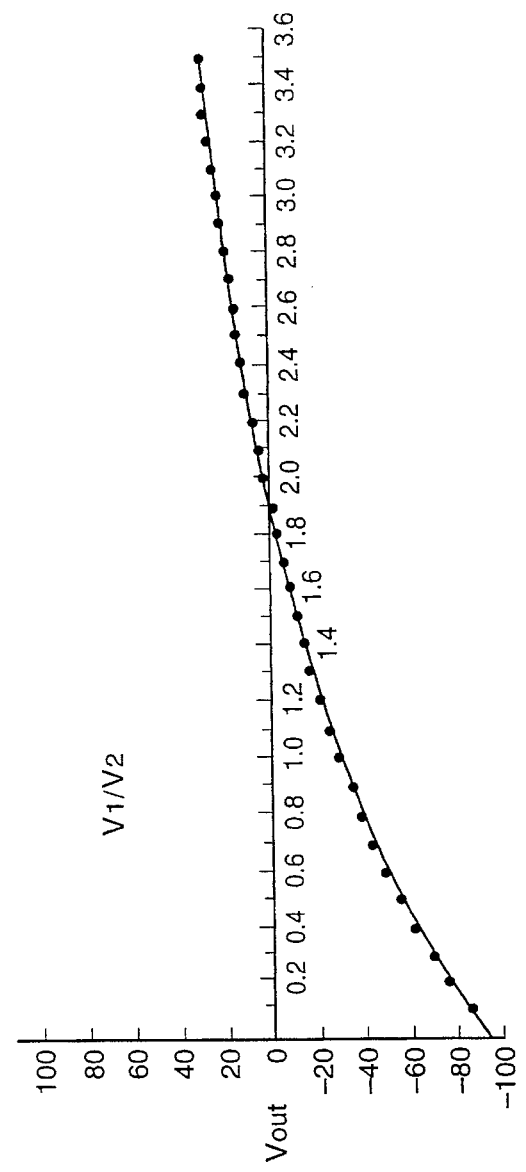
FIG. 3 is another diagram of the output characteristics of V1/V2 of the circuit shown in FIG. 1.

A performance curve of Z is shown in FIG. 3.

From FIGS. 2 and 3, it is apparent that the inclination of Vout is steep when X or Z is small, and lens steep when X or Z is large. The proportion of Vg1 to Vg2 or its inversion, that is, the proportion of a summation from Vin, V1(n−1), V1(n−2), V(n−3), ..., V11, to a summation from V2m, V2(m−1), V2(m−2), V2(m−3), ..., V21, or its inversion influences Vout more as they become smaller. Formula (9) is partially differentiated by V1 so that $$(\partial Vout/\partial V1)=\{2X(2+\lambda Vd)\}/\{V1^2(1+2X)\}\geq 0. \quad (13)$$

Formula (9) is also partially differentiated by V2 so that $$(\partial Vout/\partial V2)=\{-2(2+\lambda Vd)\}/\{\lambda V1^2(1+2X)\}\geq 0. \quad (14)$$

When Vg2 is constant, the larger Vg1 becomes, the more Vout increases. Vout converges to the value in formula (10). When Vg1 is constant, the large Vg2 becomes, the less Vout decreases. Vout converges to the value in formula (11). In the above relationship, Vout cannot become more than Vd or less than Vss. When Vout approaches Vd or Vss, the change rate decreases.

The pMOS FET T1 is energized by the summation of (V11, V12, ..., Vin) as the gate voltage Vg1 so that Vout is increased. While, by the summation of (V21, V22, ..., V2n) as Vg2, Vout is decreased.

A neural network is accurately modeled by the addition circuit in FIG. 1. This circuit is rather simple for constructing an artificial neural network. The weight of the synapses in this neural network can be adjusted by adjusting the capacitance values of C1n and C2m. Capacitances in a LSI circuit are easily constructed by shaping a metal layer for wiring and an emitter diffusion layer on both sides of SiO2. The input voltage is provided through capacitances at the gate of a MOS FET, so that the input impedance is high and an electric power is spared. According to the first embodiment, an addition circuit is obtained by a simple, low power circuit with high speed. This embodiment is also suitable for a large scale artificial neural network.

Figure 4:
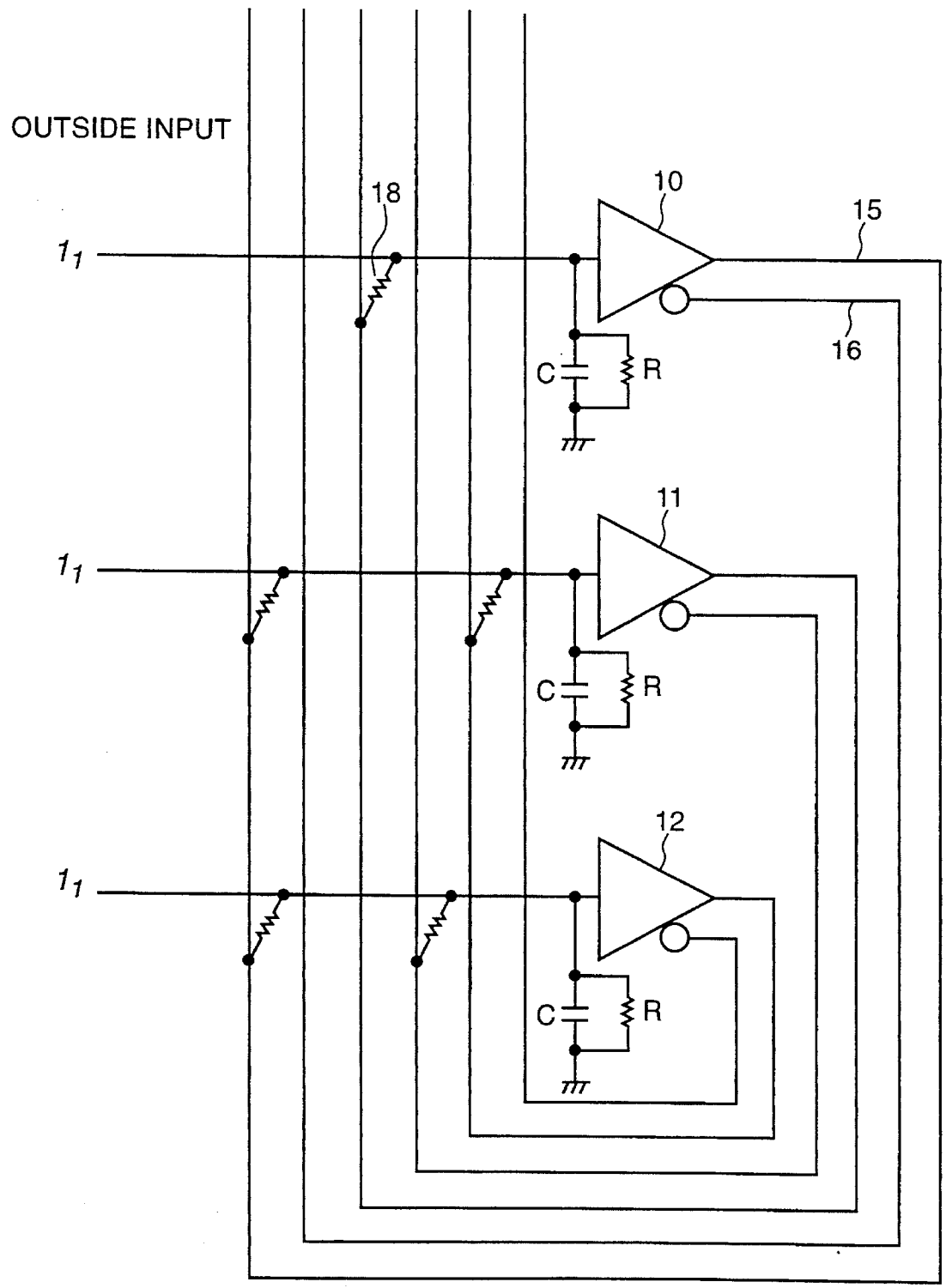
FIG. 4 shows a conventional computational circuit.

FIG. 4 shows one conventional neural network disclosed in the U.S. Pat. No. 4,660,166. In FIG. 4, cell bodies of a neuron consist of operational amplifiers 10, 11 and 12, and axons for transmitting action potential from one cell body to the following cell bodies via signal lines 15 and 16. A resister 18 is provided as a synapse for connecting the axon and an action potential input of the cell body.

Figure 5:
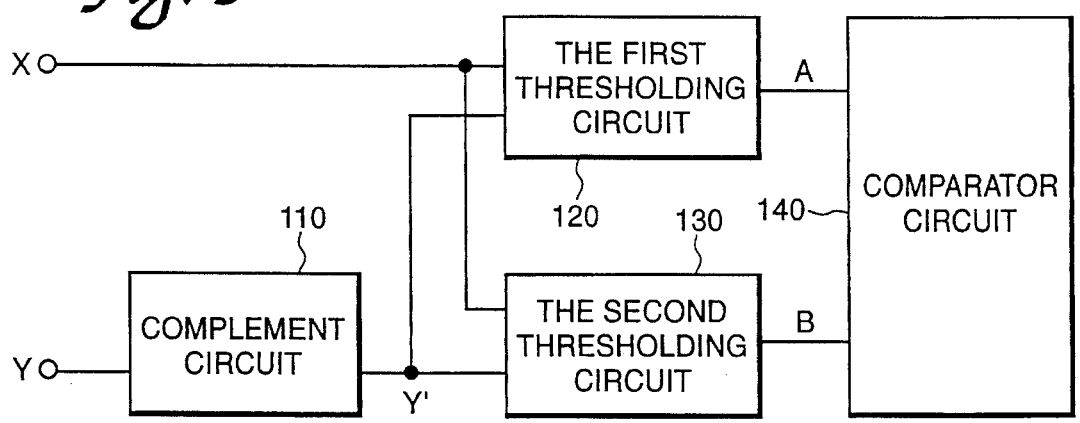
FIG. 5 is a block diagram showing a first embodiment of a comparator circuit.

FIG. 5 shows an embodiment of a comparator circuit that includes two thresholding circuits 120 and 130 and one complement circuit 110. Since substraction is usually necessary for comparison, negative numbers have to be handled. However, in the present invention, a complement circuit is applied to the circuit of FIG. 5 in order to execute a comparison without negative number calculations.

Numbers X and Y to be compared are input to the comparator circuit as voltage signals; X is input to the first and second thresholding circuits 120 and 130, and Y is input to the complement circuit 110 which outputs a complement of Y to the circuits 120 and 130. When the numbers X and Y are of radix of "R", a complement Y' of the number Y is calculated as below.

$$Y'=R-Y-1 \quad (15)$$

and,

If $X+Y'>R-1$ then $X>Y$, (16)

If $X+Y'=R-1$ then $X=Y$, and (17)

If $X+Y'<R-1$ then $X<Y$. (18)

No negative number occurs in this calculation. Here, an octal number of R=8 is used, and the calculation result of X+Y' is shown in Table 1.

TABLE 1

| | | \multicolumn{8}{c}{X+Y' for X, Y, Y'} |
|---|---|---|---|---|---|---|---|---|---|
| | | \multicolumn{8}{c}{X} |
| Y | Y' | 0 | 1 | 2 | 3 | 4 | 5 | 6 | 7 |
| 0 | 7 | 7 | 8 | 9 | 10 | 11 | 12 | 13 | 14 |
| 1 | 6 | 6 | 7 | 8 | 9 | 10 | 11 | 12 | 13 |
| 2 | 5 | 5 | 6 | 7 | 8 | 9 | 10 | 11 | 12 |
| 3 | 4 | 4 | 5 | 6 | 7 | 8 | 9 | 10 | 11 |
| 4 | 3 | 3 | 4 | 5 | 6 | 7 | 8 | 9 | 10 |
| 5 | 2 | 2 | 3 | 4 | 5 | 6 | 7 | 8 | 9 |
| 6 | 1 | 1 | 2 | 3 | 4 | 5 | 6 | 7 | 8 |
| 7 | 0 | 0 | 1 | 2 | 3 | 4 | 5 | 6 | 7 |

Figure 6:
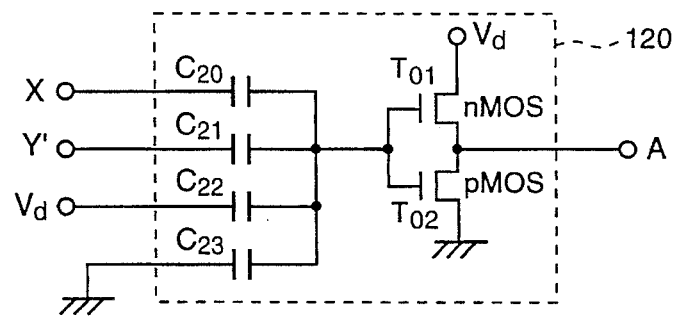
FIG. 6 is a circuit diagram of a thresholding circuit used in the circuit of FIG. 5.

FIG. 6 is a circuit diagram of the threshold circuit 120, which consists of capacitors C20, C21, C22 and C23 connected in parallel for capacitive coupling. X and Y' are connected to C20 and C21. C22 and C23 are connected to a reference voltage Vd and the ground, respectively. The capacitive coupling generates an output of, $$(C20X+C21Y'+C22Vd)/(C20+C21+C22+C23) \quad (19)$$

The output of the capacitive coupling is connected to a source follower consisting of an nMOS transistor T01 and a pMOS transistor T02. The drain of T01 is connected to a voltage Vd. The source of T01 is connected to the drain of T02, and the source of T02 is connected to ground. The output of the capacitive coupling is input to the gate of T01 and T02, and an output A is generated at a juncture between the source of T01 and drain of T02. The source follower has a threshold voltage corresponding to the radix itself "8". The output A is inversion voltage of Vd when the output of the capacitive coupling reaches the threshold voltage. Otherwise, it is not inverted so to be "0". The threshold circuit 130 is similar to, but different from the threshold voltage from the circuit 120. The threshold voltage is less by one than the radix and output B is Vd when the output of the capacitive coupling is not less than the threshold and otherwise "0".

The outputs from the threshold circuits are input to a judgment circuit for performing the following judgment in Table 2.

TABLE 2

| | Judgment by the judgment circuit | |
|---|---|---|
| judgment | Output A | Output B |
| X>Y | 1(Vd/inverted) | 1(Vd) |
| X=Y | 1 | 0 |
| X<Y | 0 | 0 |

The judgment circuit may be a conventional logical circuit.

Figure 7:
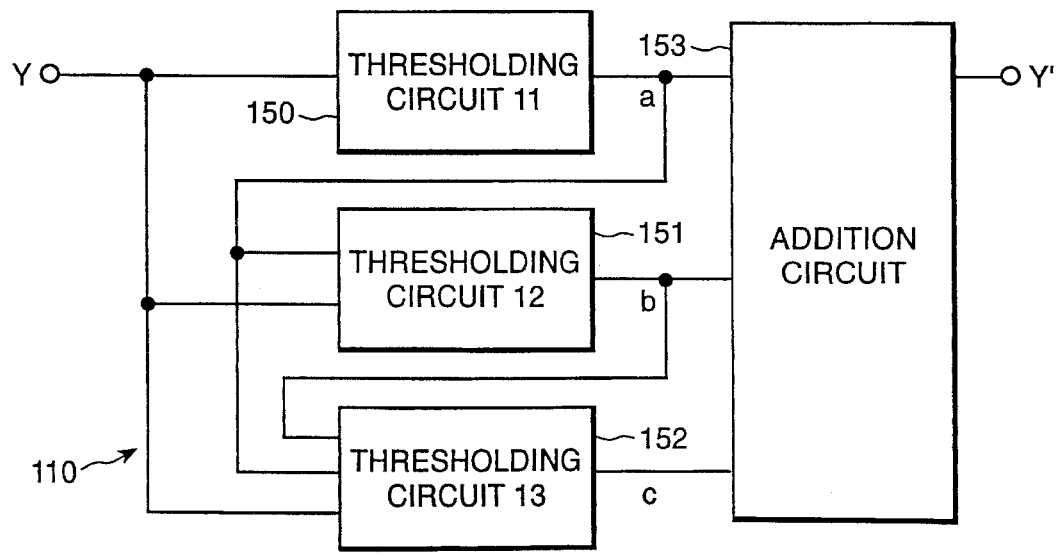
FIG. 7 is a complement circuit using the circuit shown in FIG. 5, FIGS. 8(a)–8(c) illustrate the thresholding circuits of the circuit in FIG. 7.

The complement circuit consists of a plurality of thresholding circuits 150, 151 and 152, as shown in FIG. 7, which output Vd as "1" when the input exceeds their threshold. The thresholds are "4", "2" and "1" for the circuits 150, 151 and 152, respectively. The circuits output a, b and c to an addition circuit 153 which calculates a weighted addition of a, b and c so that the input is converted into a octal number as well as converted into a complement of the octal number. Table 3 shows a relationship between the input Y and octal number.

TABLE 3

| analog voltage Y and octal number and complement | | |
|---|---|---|
| Y | octal number | complement |
| 0≦ A<Vd/8 | 0 | 7 |
| Vd/8≦ A<2Vd/8 | 1 | 6 |
| 2Vd/8≦ A<3Vd/8 | 2 | 5 |
| 3Vd/8≦ A<4Vd/8 | 3 | 4 |
| 4Vd/8≦ A<5Vd/8 | 4 | 3 |

TABLE 3-continued

| analog voltage Y and octal number and complement | | |
|---|---|---|
| Y | octal number | complement |
| 5Vd/8≦ A<6Vd/8 | 5 | 2 |
| 6Vd/8≦ A<7Vd/8 | 6 | 1 |
| 7Vd/8≦ A<8Vd/8 | 7 | 0 |

The threshold circuits 150, 151 and 152 correspond to bits of MSB, the second bit and LSB, and each circuit receives outputs of upper bit circuits together with Y. The connection of each threshold circuit has weights for inputs so that its output is inverted or not inverted in response to Y.

Figure 8A:
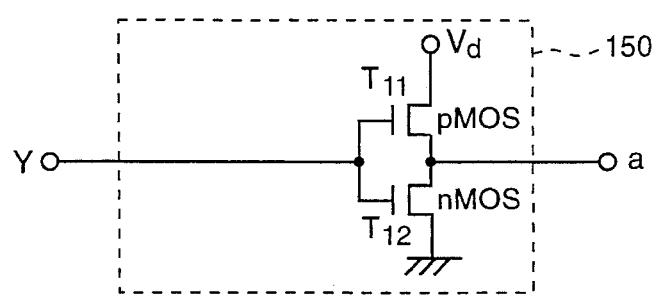

In FIG. 8(a), the threshold circuit 150 has a source follower which receives Y, and outputs Vd when Y is not less than the threshold Vd/2 and "0" otherwise.

Figure 8B:
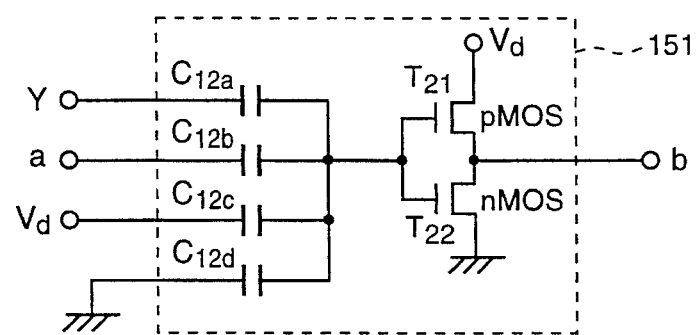

In FIG. 8(b), the threshold circuit 151 has a capacitive coupling connected to Y, a, Vd and ground, with weights 4:2:1:1, respectively. The output of the capacitive coupling is input to a source follower with the same threshold of Vd/2.

Figure 8C:
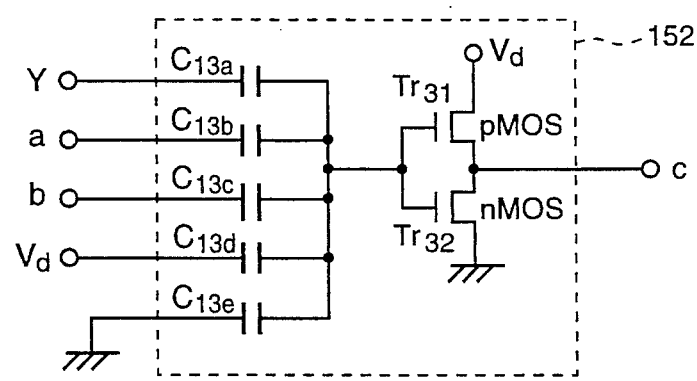

In FIG. 8(c), the threshold circuit 152 has a capacitive coupling connected to Y, a, b, Vd and ground, with weights 8:4:2:1:1, respectively. The output of the capacitive coupling is input to a source follower with the same threshold of Vd/2. The outputs a, bb and c are shown in Table 4, 5 and 6. In Tables, the outputs from the capacitive couplings are shown in Vout151 and Vout152 for the circuit 151 and 152.

TABLE 4

| Outputs of Thresholding Circuit 150 and Input Y | | | | | | | | | |
|---|---|---|---|---|---|---|---|---|---|
| Input Y | 0 | 1/8 | 2/8 | 3/8 | 4/8 | 5/8 | 6/8 | 7/8 | 8/8 |
| Output a | 1 | 1 | 1 | 1 | 1 | 0 | 0 | 0 | |

TABLE 5

| Outputs of Thresholding Circuit 151 and Input Y | | | | | | | | | |
|---|---|---|---|---|---|---|---|---|---|
| Input | 4 × Y | 0 | 0.5 | 1 | 1.5 | 2 | 2.5 | 3 | 3.5 | 4 |
| Input | 2 × a | 2 | 2 | 2 | 2 | 2 | 0 | 0 | 0 | 0 |
| Vd | | 1 | 1 | 1 | 1 | 1 | 1 | 1 | 1 | 1 |
| Vout151 | | 3/8 | 3.5/8 | 4/8 | 4.5/8 | 5/8 | 3.5/8 | 4/8 | 4.5/8 | 5/8 |
| Output b | | | 1 | 1 | 0 | 0 | 1 | 1 | 0 | 0 |

TABLE 6

| Outputs of Thresholding Circuit 152 and Input Y | | | | | | | | | |
|---|---|---|---|---|---|---|---|---|---|
| Input | 8 × Y | 0 | 1 | 2 | 3 | 4 | 5 | 6 | 7 | 8 |
| Input | 4 × a | 4 | 4 | 4 | 4 | 4 | 0 | 0 | 0 | 0 |
| Input | 2 × b | 2 | 2 | 2 | 0 | 0 | 2 | 2 | 0 | 0 |
| Vd | | 1 | 1 | 1 | 1 | 1 | 1 | 1 | 1 | 1 |
| Vout152 | | 7/16 | 8/16 | 9/16 | 8/16 | 9/16 | 8/16 | 9/16 | 8/16 | 9/16 |
| Output c | | | 1 | 0 | 1 | 0 | 1 | 0 | 1 | 0 |

Figure 9:
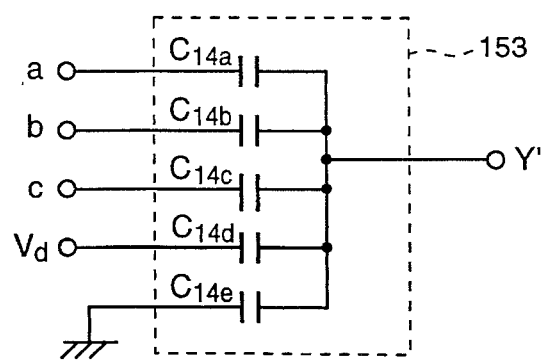
FIG. 9 illustrates an addition circuit of the circuit of the circuit in FIG. 7.

The addition circuit 153 is shown in FIG. 9. A capacitive coupling is provided for weighted addition of a, b, c and Vd with weights provided by capacitors C14a, C14b, C14c, C14d and C14e. The capacitances of these capacitors are 4:2:1:1 in ratio. Table 7 shows the addition result of the circuit 114.

TABLE 7

| | | Outputs of Addition Circuit 152 | | | | | | | | |
|---|---|---|---|---|---|---|---|---|---|---|
| | | 0 | 1/8 | 2/8 | 3/8 | 4/8 | 5/8 | 6/8 | 7/8 | 8/8 |
| Input | Y | | | | | | | | | |
| Input | 8 × a | | 8 | 8 | 8 | 8 | 0 | 0 | 0 | 0 |
| Input | 4 × b | | 4 | 4 | 4 | 4 | 4 | 0 | 0 | 0 |
| Input | 2 × c | | 2 | 2 | 2 | 0 | 0 | 2 | 2 | 0 |
| Vd | | | 1 | 1 | 1 | 1 | 1 | 1 | 1 | 1 |
| Output | Y' | | 15/16 | 13/16 | 11/16 | 9/16 | 7/16 | 5/16 | 3/16 | 1/16 |

The output Y' is defined as an intermediate value between the threshold value of Y in order to prevent errors in the circuit following to the addition circuit. If it is defined as the threshold values, the judgment becomes uneasy whether the value is more or less than a threshold due to noises. The addition is accurately performed under the condition that the current on the output is nearly "0". AMOS source follower should be connected to the output if the output impedance is not sufficiently low.

The threshold level of the above inverters are Vd/2 commonly and the ratio of capacitances are defined for uniform step size of the quantization. When the quantization steps are not equal, the capacitance ratio is different from the above.

Figure 10:
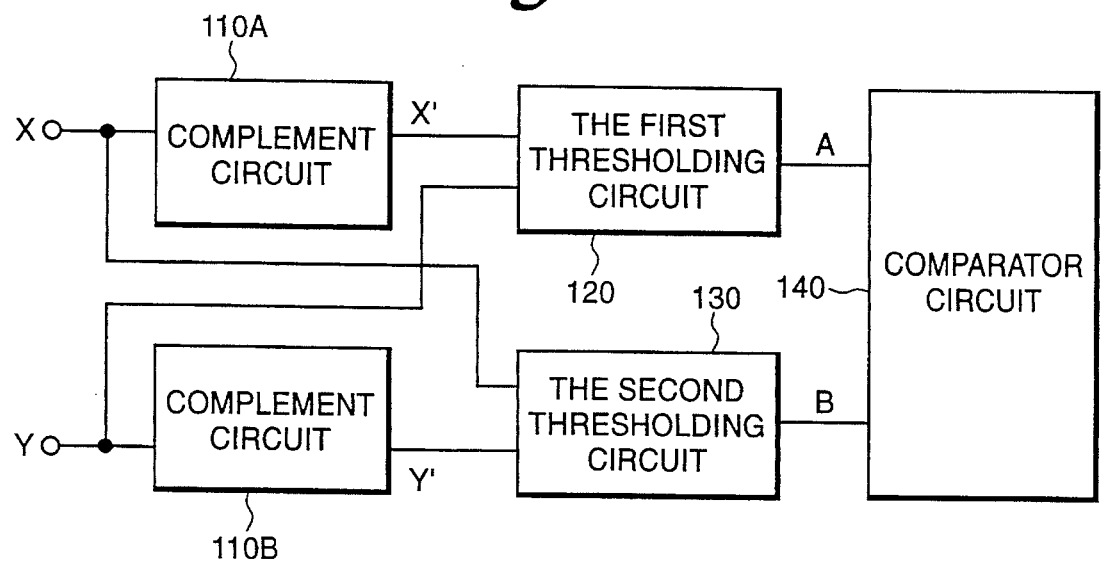
FIG. 10 illustrates a second embodiment of a comparator circuit.

FIG. 10 shows the fourth embodiment of comparator circuit which has an addition complement circuit for the threshold circuit 120. There are two complement circuits 110A and 110B for the thresholding circuits 120 and 130, respectively. The thresholding circuits have threshold voltages corresponding to the maximum threshold for quantizing, that is, the multi-value of "7". According to this circuit, the following judgment is performed. Here, X=Y if both outputs A and B are inverted, X<Y if the output A is inverted, and X>Y if B is inverted.

TABLE 8

| Judgment by the Judgment Circuit | | |
|---|---|---|
| judgment | output A | output B |
| X>Y | 0 | 1 |
| X=Y | 1 | 1 |
| X<Y | 1 | 1 |

Both threshold circuits 120 and 130 have the threshold values of "7", which is different from the third embodiment in which the circuit 120 has of threshold "8". Therefore, the fourth embodiment has advantages in manufacturing because less threshold levels are used.

Figure 11:
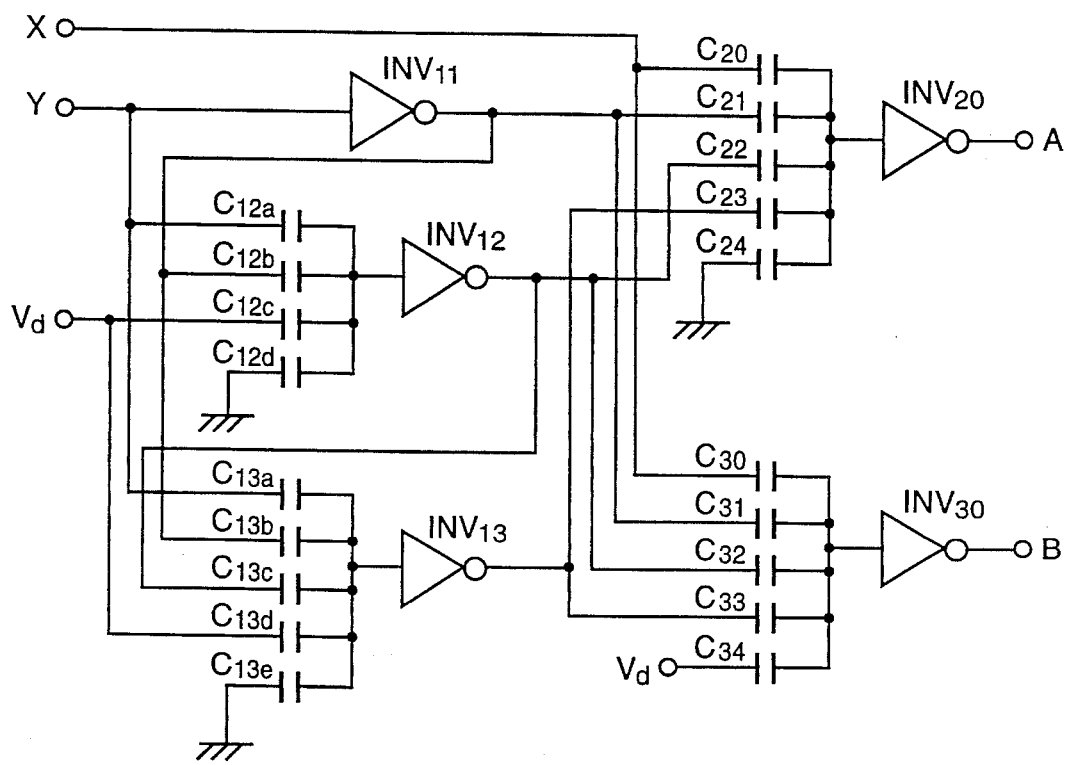
FIG. 11 illustrates a third embodiment of a comparator circuit.

FIG. 11 is the fifth embodiment of comparator circuit with similar function to that of the circuit of FIG. 5, in which the circuit is simplified. Outputs from a portion corresponding to the above complement circuit are connected in parallel and directly input to capacitances of the first and second thresholding circuits. The portion consists of an inverter INV11 corresponding to the thresholding circuit 150, a combination of INV12 and capacitors C12$a$, C12$b$, C12$c$ and C12$d$ corresponding to the thresholding circuit 151, and a combination of INV13 and capacitors C13$a$, C13$b$, C13$c$, C13$d$ and C13$e$ corresponding to the thresholding circuit 152.

The portion of the circuit in FIG. 11 corresponding to the thresholding circuit 120 consists of an inverter INV20 and capacitors C20, C21, C22, C23 and C24 commonly connected at their output terminal to an input of INV20. C20, C21, C22, C23 and C24 are connected to X, an output of INV11, an output of INV12, an output of INV13 and ground, respectively. These capacitors have capacitance ratios of 8:4:2:1:1. INV20 inverts the input when the input exceeds "8".

The portion of the circuit in FIG. 11 corresponding to the thresholding circuit 130 consists of an inverter INV30 and capacitors C30, C31, C32, C33 and C34 commonly connected at their output terminal to an input of INV30. C30, C31, C32, C33 and C34 are connected to X, an output of INV11, an output of INV12, an output of INV13 and Vd, respectively. These capacitors have capacitance ratios of 8:4:2:1:1. INV20 inverts the input when the input exceeds "7". This circuit has output characteristics of Table 2 above.

What is claimed is:

1. A computational circuit comprising:

a complement circuit receiving a first analog input voltage for quantizing said first analog input voltage and outputting a complement of said quantized first analog input voltage;

a first threshold circuit for adding said complement and a second analog input voltage, said first threshold circuit including a capacitive coupling connected to a transistor pair, said transistor pair having a first threshold voltage, said first threshold circuit outputting a low voltage if a result of adding said complement and said second analog input voltage exceeds said first threshold voltage;

a second threshold circuit for adding said complement and said second analog input voltage, said second threshold circuit including a capacitive coupling connected to a second transistor pair having a second threshold voltage, said second threshold circuit outputting a low voltage if a result of adding said complement and said second analog input voltage exceeds said second threshold voltage which is different from said first threshold voltage; and a judging circuit for judging which one of said first and said second analog input voltages is greater based on outputs of said first and said second threshold circuits.

2. A computational circuit comprising:

a first complement circuit receiving a first analog input voltage for quantizing said first analog input voltage and outputting a first complement of first quantized first analog input voltage;

a second complement circuit receiving a second analog input voltage for quantizing said second analog input voltage and outputting a second complement of said quantized second analog input voltage;

a first threshold circuit for adding said first complement and said second analog input voltage, said first threshold circuit including a first capacitive coupling connected to a first transistor pair, said first transistor pair having a first threshold voltage, said first threshold outputting a low voltage if a result of adding said first complement and said second analog input voltage exceeds said first threshold voltage;

a second threshold circuit for adding said second complement and said first analog input voltage, said second threshold circuit including a second capacitive coupling connected to a second transistor pair having a second threshold voltage, said second threshold circuit outputting a low voltage if a result of adding said second complement and said first analog input voltage exceeds said second threshold voltage, which is different from said first threshold voltage; and a judging circuit for judging which one of said first and said second analog input voltages is greater based on outputs of said first and said second threshold circuits.

* * * * *